(12) United States Patent  (10) Patent No.: US 7,729,186 B2
Kliewer et al.  (45) Date of Patent: Jun. 1, 2010

(54) METHOD AND SYSTEM FOR TESTING AN INTEGRATED CIRCUIT

(75) Inventors: Joerg Kliewer, München (DE); Klaus Nierle, Essex Junction, VT (US); Martin Versen, Feldkirchen-Westerham (DE)

(73) Assignee: Qimonda AG, Munich (DE)

( * ) Notice: Subject to any disclaimer, the term of this patent is extended or adjusted under 35 U.S.C. 154(b) by 210 days.

(21) Appl. No.: 12/022,422

(22) Filed: Jan. 30, 2008

(65) Prior Publication Data

US 2008/0205173 A1  Aug. 28, 2008

(30) Foreign Application Priority Data

Jan. 30, 2007 (DE) .................. 10 2007 004 555

(51) Int. Cl.
*G11C 7/00* (2006.01)
(52) U.S. Cl. ...................... 365/201; 365/195
(58) Field of Classification Search ................. 365/201, 365/195
See application file for complete search history.

(56) References Cited

U.S. PATENT DOCUMENTS

2005/0082566 A1* 4/2005 Menard et al. .............. 257/119

FOREIGN PATENT DOCUMENTS

| DE | 102004010704 | 10/2005 |
|---|---|---|
| DE | 102004022326 | 12/2005 |
| DE | 102005035444 | 3/2006 |

* cited by examiner

*Primary Examiner*—Michael T Tran
(74) *Attorney, Agent, or Firm*—Coats & Bennett, P.L.L.C.

(57) ABSTRACT

An integrated circuit comprising:
a) at least one integrated voltage generator for generating a low voltage for an associated integrated load;
b) an integrated voltage generator test logic connected to the voltage generator which in a test operating mode which is the operating state of that integrated voltage generator between an active operating state and a standby operating state depending on an external control signal;
c) an internal load switch for switching said generated load voltage to that integrated load said internal load switch being controllable by means of an internal control signal;
d) wherein said voltage generator test logic in said test operating mode switches the operating state of said integrated voltage generator independently of the associated internal control switching signal for setting a temporal voltage profile of said load voltage applied to that load.

19 Claims, 3 Drawing Sheets

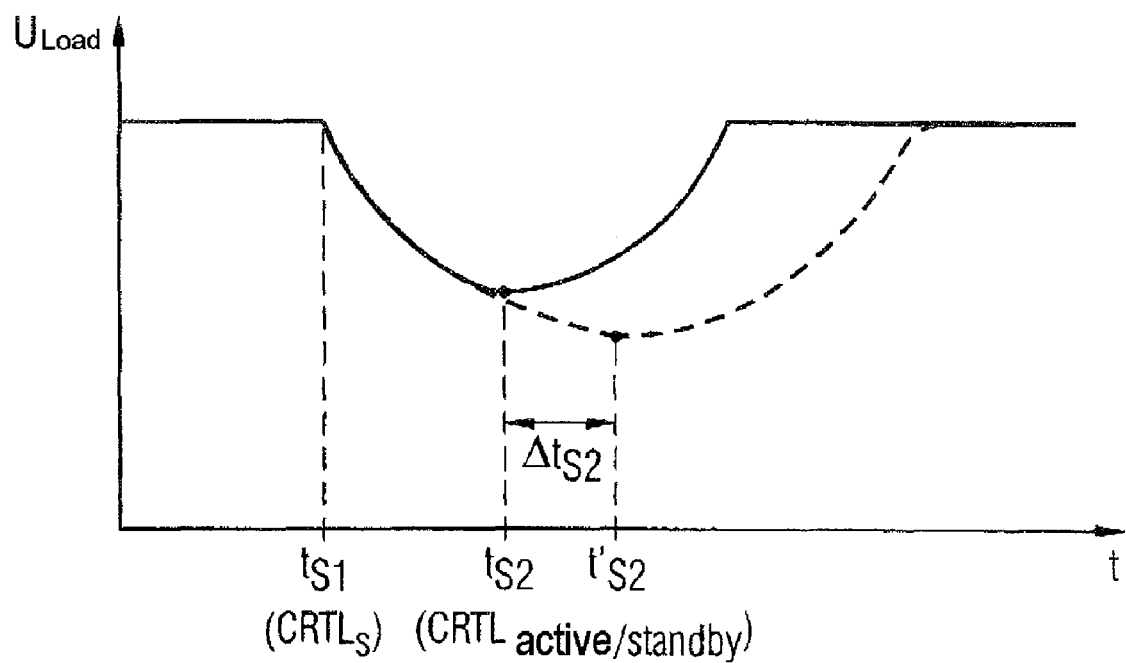

METHOD AND SYSTEM FOR TESTING AN INTEGRATED CIRCUIT

BACKGROUND OF THE INVENTION

The invention provides a method and a test system for an integrated circuit in which integrated voltage generators are changed over between different operating states for test purposes.

Integrated circuits, for example integrated memory chips, have internal or integrated voltage generators for different assemblies within the integrated circuit. An integrated voltage generator generates for example a voltage which is applied to a word line WL of a memory cell array within the integrated circuit.

FIG. 1A shows an arrangement according to the prior art, in which an internal voltage generator generates, in a manner dependent on an external supply voltage VDD and on a reference voltage generated by a reference voltage source, a voltage which switches by means of a switch S to a capacitive load, which is represented as a parallel value of a resistance $R_L$ in a capacitance $C_L$. Conventional internal voltage generators can be changed over between an active operating mode and a standby operating mode. In the standby operating mode, the voltage generator requires a lower supply current $I_{DD}$ than in the active operating mode, such that the integrated circuit overall has a lower current consumption and the generation of heat is reduced.

The internal voltage generator is switched by means of an internal control signal CRTL, which is switched between an active and a standby operating state by an internal control unit of the integrated circuit, the internal control signal being applied to the internal voltage generator via a control signal path and, if appropriate, additional internal logic circuits. The internal switch S is also driven by the internal control signal CRTL.

If the switch S is opened, the load resistance $R_{LOAD}$ is very high or infinite and falls to a low load resistance upon closing at a switching instant $t_S$, as is illustrated in FIG. 1B. At the same time, the internal voltage generator is changed over at the switching instant $t_S$ from the standby operating mode to an active operating mode in order to supply the necessary load voltage $U_{LOAD}$. During the changeover process from the standby operating mode before the switching instant $t_S$ to the active operating state during a switching duration $\Delta tS$, a voltage reduction of the load voltage $U_{LOAD}$ by a voltage value $\Delta U$ occurs, as is illustrated in FIG. 1C. The reduction of the load voltage $U_{LOAD}$ by the voltage $\Delta U$ during the switching process may lead, for example in the case of an integrated memory chip, to an unspecific malfunction in a memory cell array if the internal voltage generator supplies a switching voltage for a word line within the memory cell array.

One disadvantage of the switching arrangement according to the prior art as illustrated in FIG. 1A is that the switching instant $t_S$ for the switching of the switch S cannot be set independently of the control command for changing over the internal voltage generator between a standby operating state and an active operating state. In the case of a conventional circuit arrangement in accordance with FIG. 1A, therefore, the possibility of setting the voltage dip $\Delta U$ in the load voltage as illustrated in FIG. 1C for test purposes does not exist since the operating state of the internal voltage generator cannot be set independently of the switching state of the switch S.

Therefore, an object of the present invention is to provide a method and a test system in which the effect of a change in the load voltage generated by an integrated voltage generator on the functionality of the integrated circuit can be tested.

SUMMARY OF THE INVENTION

This object of the integrated circuit according to the invention is achieved by means of the features specified in patent claim 1.

The invention provides an integrated circuit, wherein for testing the integrated circuit in a test operating mode an operating state of at least one integrated voltage generator for generating a load voltage for an associated integrated load can be set in a manner dependent on an external control signal.

In one embodiment of the integrated circuit according to the invention, the load voltage generated by the integrated voltage generator can be switched to the integrated load by means of an internal control switching signal.

In one embodiment of the integrated circuit according to the invention, an integrated voltage generator test logic connected to the voltage generator is provided, by means of which the integrated voltage generator can be changed over between an active operating state and a standby operating state.

In one embodiment of the integrated circuit according to the invention, the voltage generator test logic in the test operating mode sets the operating state of the integrated voltage generator in a manner dependent on the external control signal.

In one embodiment of the integrated circuit according to the invention, the voltage generator test logic in the test operating mode sets the operating state of the voltage generator independently of the associated internal control switching signal.

In one embodiment of the integrated circuit according to the invention, a temporal voltage profile of the load voltage for switching the integrated voltage generator to the associated integrated load can be set by means of the predetermined external control signal.

In one embodiment of the integrated circuit according to the invention, an associated integrated voltage generator test logic is provided for each integrated voltage generator.

In one embodiment of the integrated circuit according to the invention, each voltage generator generates an associated load voltage which can be switched by means of an associated internal control signal via an internal load switch to the integrated load associated with the respective voltage generator.

In one embodiment of the integrated circuit according to the invention, provision is made of an integrated control unit for generating the internal control switching signals for driving the load switches.

In one embodiment of the integrated circuit according to the invention, the integrated control unit changes over the respective voltage generator test logic between the test operating mode and a normal operating mode in a manner dependent on further external control signals.

In one embodiment of the integrated circuit according to the invention, the voltage generator test logic in the normal operating mode, in the case of a first logic signal level of the external control signal, sets the operating state of the associated voltage generator in a manner dependent on the associated internal control signal and, in the case of a second logic signal level of the external control signal, sets the standby operating state as operating state of the associated integrated voltage generator.

In one embodiment of the integrated circuit according to the invention, the voltage generator test logic in the normal operating mode, in the case of a first logic signal level of the external control signal, sets the active operating state as operating state of the integrated voltage generator if the internal control signal switches the integrated voltage generator to the associated load, and sets the standby operating state as operating state of the voltage generator if the internal control signal isolates the integrated voltage generator from the load.

In one embodiment of the integrated circuit according to the invention, the voltage generator is connected to a thyristor for storing a switching charge.

In one embodiment of the integrated circuit according to the invention, the voltage generator is connected to a reference voltage source.

In one embodiment of the integrated circuit according to the invention, the integrated circuit is a memory chip.

In one embodiment of the integrated circuit according to the invention, the voltage generator generates a load voltage for at least one word line of a memory cell array of the memory chip.

In one embodiment of the integrated circuit according to the invention, an integrated voltage generator can be selected by means of an external code.

In one embodiment of the integrated circuit according to the invention, the external control signal is formed by a clock enable signal.

In one embodiment of the integrated circuit according to the invention, the integrated voltage generator has two operating states.

In one embodiment of the integrated circuit according to the invention, at least one integrated voltage generator is formed by a VBLH voltage generator.

In a further embodiment of the integrated circuit according to the invention, at least one of the integrated voltage generators is formed by a VBLEQ voltage generator.

In a further embodiment of the integrated circuit according to the invention, at least one of the integrated voltage generators is formed by a $V_{INT}$ generator.

The invention furthermore provides a method for testing an integrated circuit, wherein in a test operating mode, an operating state of a voltage generator contained in the integrated circuit is set in a manner dependent on an external control signal.

In one embodiment of the method according to the invention, the integrated circuit to be tested is a memory chip.

In one embodiment of the method according to the invention, an integrated voltage generator to be tested is selected by means of an external code.

In one embodiment of the method according to the invention, the external control signal is formed by a clock enable signal.

In one embodiment of the method according to the invention, the integrated voltage generator generates a load voltage which is switched to an associated integrated load of the integrated circuit.

In one embodiment of the method according to the invention, the voltage profile of the load voltage when switching the integrated voltage generator to the associated integrated load is set by means of the external control signal.

The invention furthermore provides a test system for testing at least one integrated circuit which has integrated voltage generators each having a plurality of operating states, wherein after the integrated circuit to be tested has been changed over from a normal operating mode to a test operating mode, an operating state of an integrated voltage generator selected by means of an external control signal code is set in a manner dependent on an external control signal.

Preferred embodiments of the integrated circuit according to the invention and of the method according to the invention are described below with reference to the accompanying figures for elucidating features essential to the invention.

OVERVIEW OF THE FIGURES

In the figures:

FIG. 3 shows a load voltage profile in one embodiment of the integrated circuit according to the invention.

DETAILED DESCRIPTION OF EMBODIMENTS

Figure 1A:
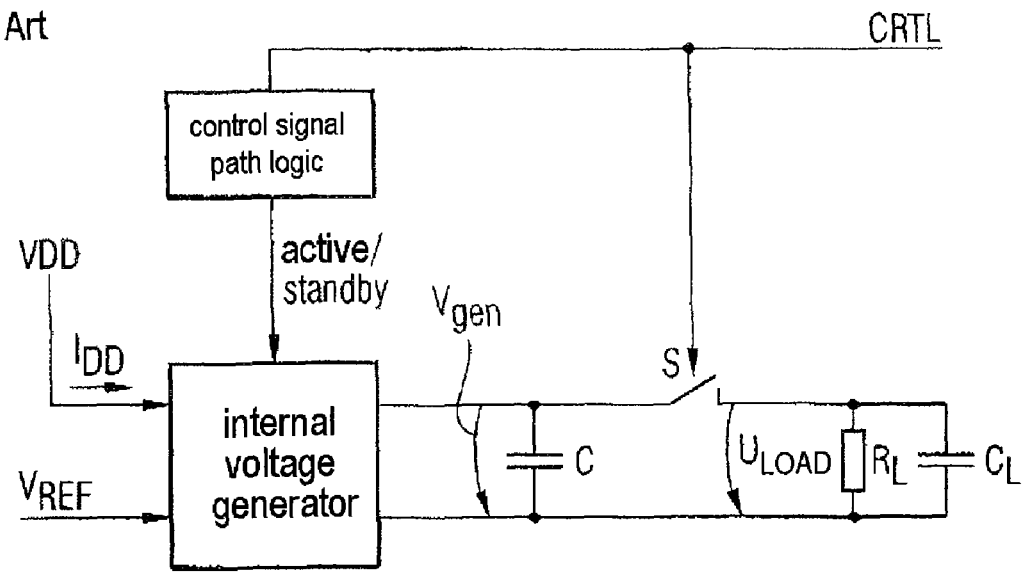
FIG. 1A shows a circuit arrangement according to the prior art.
Figure 1B:
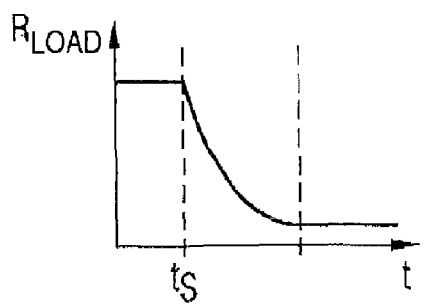
FIG. 1B shows the profile of a load resistance in the conventional circuit arrangement illustrated in FIG. 1A.
Figure 1C:
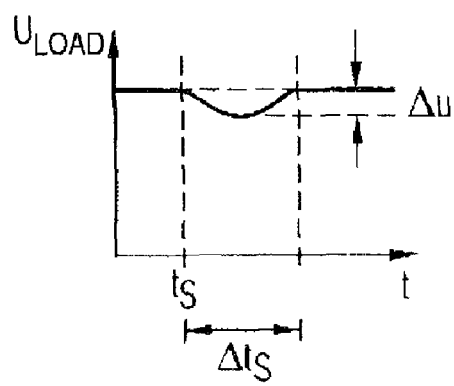
FIG. 1C shows the profile of a load voltage in the conventional circuit arrangement illustrated in FIG. 1A.
Figure 2:
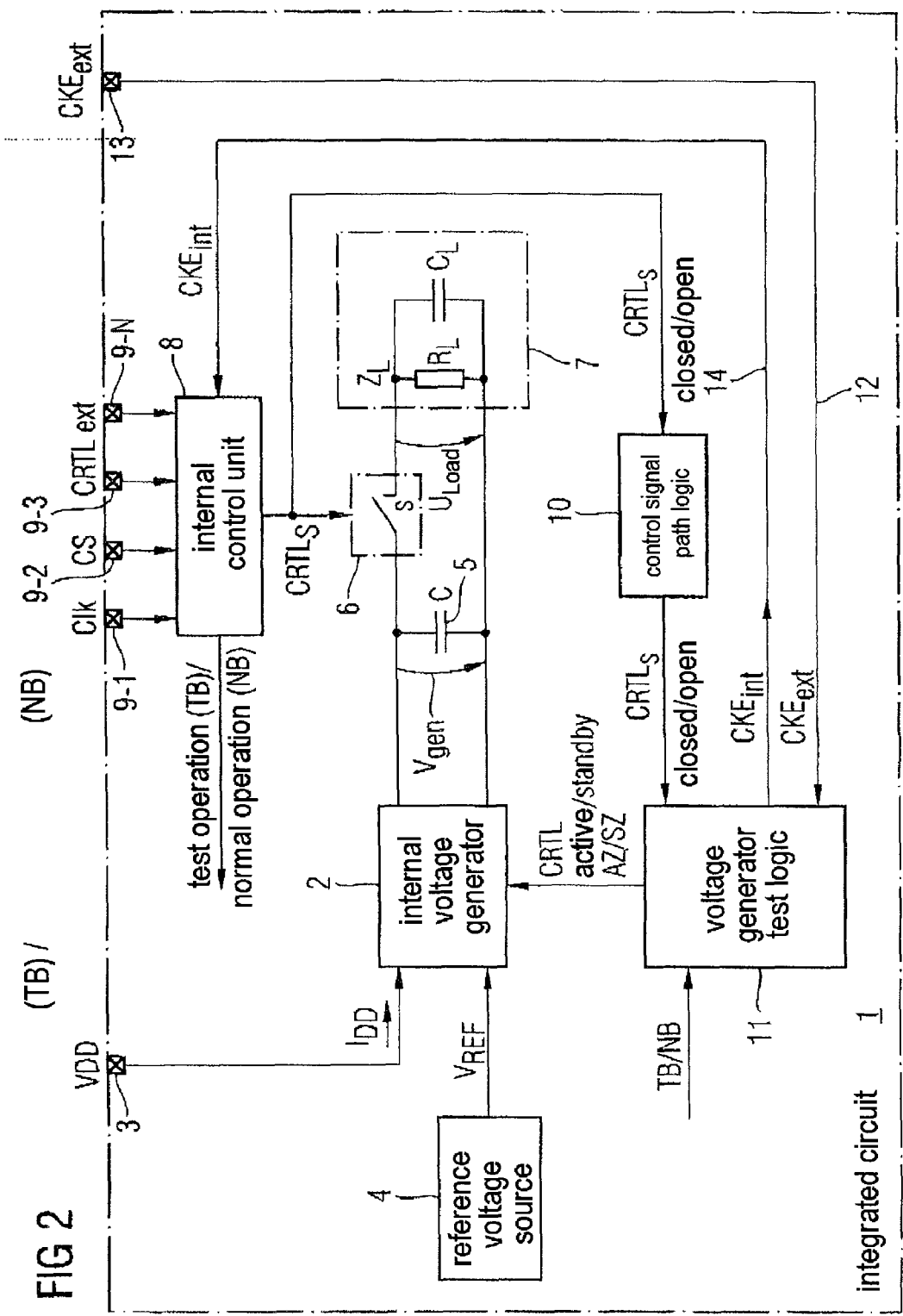
FIG. 2 shows a block diagram of one embodiment of the integrated circuit according to the invention.

As can be discerned from FIG. 2, the integrated circuit 1 in accordance with one embodiment of the invention has at least one internal voltage generator 2 for generating an internal voltage for an integrated assembly within the integrated circuit 1. The integrated circuit 1 can be any desired integrated circuit, for example any desired memory chip. The internal voltage generator 2 is for example a voltage generator for generating a switching voltage onto a word line WL of a memory cell array within an integrated memory chip. The internal voltage generator 2 generates a voltage $V_{GEN}$ in a manner dependent on an external supply voltage $V_{DD}$, which is applied at a pad 3 of the integrated circuit 1, and in a manner dependent on a reference voltage $V_{REF}$, which is preferably generated by an internal reference voltage source 4 of the integrated circuit 1. The internal voltage generator 2 has at least two states, namely an active operating state AZ and a standby operating state SZ. In the standby operating state SZ, the internal voltage generator 2 consumes a lower supply current $I_{DD}$ than in the active operating state AZ. In one embodiment, the generator voltage $V_{GEN}$ generated by the integrated voltage generator 2 is a multiple of the reference voltage $V_{REF}$ generated by the reference voltage source 4:

$$V_{GEN} = k \cdot V_{REF},$$

where k is a proportionality constant.

The reference voltage source 4 generates a constant reference voltage $V_{REF}$, which is preferably temperature-compensated. In the embodiment illustrated in FIG. 2, the integrated voltage generator 2 is connected on the output side to a so-called backup capacitance 5 for storing a switching charge. The generator voltage $V_{GEN}$ is switched via a load switch 6 to an integrated load 7, which can be any desired assembly within the integrated circuit 1. The integrated load 7 has a complex impedance $Z_L$ composed for example of a capacitive load $C_L$ and a resistive load $R_L$. The load voltage generated by the integrated voltage generator 2 can be switched to the integrated load 7 by means of an internal control switching signal $CRTL_S$ for controlling the load switch 6. Said internal control switching signal $CRTL_S$ is generated by an internal control unit 8. The internal control unit 8 is connected to control signal pads 9-1 to 9-N of the integrated circuit 1. In a manner dependent on the external control signals applied to the pads 9-i, the internal control unit 8 generates the control switching signal $CRTL_S$ for the load switch 6. Furthermore, the integrated circuit 1 can be changed over between a test operating mode TB and a normal operating mode NB in a manner dependent on the external control signals CRTL$_{EXT}$. If the integrated circuit 1 has a plurality of internal voltage generators 2 which can be switched via associated load switches 6 and via respective associated internal assemblies, the integrated control unit 8 generates the respective internal control switching signal CRTL$_S$ for the respective load switches 6.

The internal control switching signal CRTL$_S$ is applied via a control signal path logic 10, which contains delay elements, for example, to a voltage generator test logic 11 for the integrated voltage generator 2. In one possible embodiment of the integrated circuit 1, each internal or integrated voltage generator 2 has an associated voltage generator test logic 11. In an alternative embodiment, the integrated circuit 1 has a common voltage generator test logic 11 for all the internal voltage generators 2. The voltage generator test logic 11 changes over the voltage generator 2 between different operating states. In the embodiment illustrated in FIG. 2, the integrated voltage generator 2 can be changed over between an active operating state AZ and a standby operating state SZ. If the integrated circuit 1 is switched from a normal operating mode NB to a test operating mode with the aid of the external control signals applied to the signal pads 9-1, the voltage generator test logic 11 switches the associated internal voltage generator 2 in a manner dependent on an external control signal CKE$_{EXT}$, which is fed from outside to the voltage generator test logic 11 via an internal control line 12 from a signal pad 13. The external control signal CKE$_{EXT}$ is preferably a control signal of a pin or signal pad that is not used in test operation, for example a clock enable control signal CKE. For testing the integrated circuit 1, therefore, in the test operating mode TB, an operating state of the integrated voltage generator 2 for generating the load voltage for the associated integrated load 7 is set in a manner dependent on the external control signal CKE$_{EXT}$ applied to the pad or pin 13. In the embodiment illustrated in FIG. 2, the voltage generator test logic 11 changes over the internal voltage generator 2 between an active operating state AZ and a standby operating state SZ in the test operating mode TB. The voltage generator test logic 11 is furthermore connected to the internal control unit 8 via a control line 14 and outputs the received external control signal CKE$_{EXT}$ to the internal control unit 8.

As can be discerned from FIG. 2, the voltage generator test logic 11 makes it possible, in the test operating mode TB to change over the operating state of the voltage generator 2 independently of the associated internal control signal CRTL$_S$. As a result, it becomes possible to set a temporal voltage profile of the load voltage U$_{LOAD}$ for switching the integrated voltage generator 2 to the associated integrated load 7 by means of the external control signal CKE$_{EXT}$ in the test operating mode TB.

In one possible embodiment, in the normal operating mode NB of the integrated circuit, at a first logic signal level of the external control signal, for example CKE$_{EXT}$=1, the voltage generator test logic 11 sets the operating state of the associated voltage generator 2 in a manner dependent on the associated internal control signal CRTL$_S$ supplied by the internal control unit 8 via the control signal path logic 10. In the case of a second logic signal level of the external control signal, for example CKE$_{EXT}$=0, the voltage generator test logic 11 in the normal operating mode NB sets the standby operating mode SZ as operating state of the associated voltage generator 2.

The voltage generator test logic 11 in the normal operating mode NB, in the case of the first logic signal level of the external control signal (CKE$_{EXT}$=1), sets the active operating state AZ as operating state of the voltage generator 2 if the internal control signal CRTL$_S$ switches the voltage generator 2 to the associated load 7. Conversely, the voltage generator test logic 11 in the normal operating state NB, in the case of the first logic signal level of the external control signal (CKE$_{EXT}$=1), sets the standby operating state SZ as operating state of the voltage generator 2 if the internal control signal CRTL$_S$ isolates the voltage generator 2 from the associated load 7.

The integrated circuit 1 can have different integrated voltage generators 2, for example a VBLH voltage generator, a VBELQ voltage generator or a V$_{INT}$ voltage generator. In this case, the integrated voltage generator that is respectively to be tested can preferably be selected by means of an external TM code.

| Generator to be switched | TM Code |
|---|---|
| VBLH | 001 |
| VINT | 010 |
| VBLEQ | 100 |

In one possible embodiment, the TM code can also encode which of the voltage generators is in a standby operating state SZ or in an active operating state AZ, for example:

TM CODE=001; CKE=low—VBLH standby, VINT, VBLEQ active generators are switched on
TM CODE=001; CKE=high—VBLH, VINT, VBLEQ active generators are switched on
TM CODE=010; CKE=low—VINT standby, VBLH, VBLEQ active generators are switched on
TM CODE=111, CKE=low—VBLH, VINT, VBLEQ standby generators are switched on One possible test specimen of an integrated circuit 1 is for example:

| | |
|---|---|
| CKE low | (standby generators switched on) |
| IDLE | |
| ACT x | (an activation with standby generator takes place here) |
| IDLE | |
| READ | (reading with standby generator takes place here) |
| CKE high | (active generators switched on for other chip functions, e.g. refresh) |
| IDLE with waiting time | |
| CKE low | (standby generators switched on) |
| PRE | (a precharge with standby generator takes place here) |

FIG. 3 shows the voltage profile of a load voltage U$_{LOAD}$ in one possible embodiment of the integrated circuit 1 according to the invention.

At a switching instant t$_{S1}$, by way of example, the switch 6 is changed over from an open switching position to a closed switch position by means of the internal control signal CRTL$_S$, that is to say the internal voltage generator 2 is switched to the internal load 7 of the integrated circuit 1, the integrated voltage generator 2 still being in the standby operating state SZ at this instant. Accordingly, the load voltage U$_{LOAD}$ at the internal load 7 decreases. At the switching instant t$_{S2}$, through external driving of the integrated voltage generator test logic 11 of the internal voltage generator 2, the latter is changed over from the standby operating state SZ to the active operating state AZ, such that the load voltage U$_{LOAD}$ at the load 7 rises. By shifting the switching instant t$_{S2}$ to the switching instant t$_{S2'}$, the profile of the load voltage U$_{LOAD}$ is set for test purposes, as is illustrated in FIG. 3. By way of example, it is possible to test how a change in a switching voltage profile for a word line WL within an integrated memory chip 1 affects the functionality of the memory chip 1. The voltage reduction illustrated in FIG. 3 can be set by means of the test circuit arrangement according to the invention since the switch 6 can be driven independently of the operating state of the generator 2.

In the method according to the invention, in a test operating mode TB, the state of the voltage generator 2 contained in the integrated circuit 1 is set in a manner dependent on the external control signal $CKE_{EXT}$. In this case, the method according to the invention is suitable on the one hand for testing finished integrated circuits or memory chips and on the other hand for testing prototypes in a verification phase. The voltage dip illustrated in FIG. 3, or the reduction in the voltage profile that can be set for test purposes, permits tolerances of components or assemblies to be ascertained without impairing the functionality of the integrated circuit. For testing a finished produced chip or a finished produced integrated circuit 1, the voltage reduction illustrated in FIG. 3 is set in the manner as expected in a normal application and the integrated circuit 1 is subsequently tested with regard to its functionality. If the voltage reduction set in FIG. 3 leads to a malfunction of the integrated circuit 1, the integrated circuit 1 cannot be shipped.

The test method according to the invention is also suitable for testing prototypes of integrated circuits 1 since, in a verification phase, the voltage reduction illustrated in FIG. 3 is set in accordance with a worst-case scenario and the assemblies of the integrated circuit 1 that are supplied by the voltage source 2 are subsequently designed in such a way that they operate without any faults even in the event of such a voltage dip or such a voltage reduction, that is to say the design of the integrated circuit 1 is designed correspondingly robustly.

Exemplary applications of the test method according to the invention are given below.

The integrated voltage generator 2 can be a VBLH voltage generator. After the activation of the integrated circuit 1 or memory chip, by means of an activate command, the information data contained in memory cells are amplified by sense amplifiers. The current required for this purpose or the voltage required for this purpose is made available by the bit line voltage (VBLH) active voltage generators. These voltage generators are switched off after a specific time. The transition takes place after approximately 250 nsec. If, in the so-called VBLH standby operating mode, the bit lines BL are kept set for a long time, i.e. for a few msec, the current made available by the VBLH standby voltage generator is usually sufficient. In the fault case, by contrast, the voltage dips and, when the word line WL is closed, the dipped voltage is written to the memory cells. In the method according to the invention, in the test operating mode TB, the standby voltage generator can already be tested after activation, for example by means of a rewriting of the stored cell information items. This leads to a considerable time saving since this process takes a few nsec rather than msec.

If the internal voltage generator 2 is a VBLH generator, the above-described transition to the standby operating state prevents another test process where leakage between the bit lines BL are tested. The sense timing of the sense amplifiers is delayed in this test process. This time delay is longer than that time duration which has to elapse before the active voltage generator is switched off and a constrained fault case occurs. The standby voltage generator cannot provide the necessary voltage or power for all of the sense amplifiers simultaneously. The use of the active voltage generator is constrained by this test process, such that the sense timing can be delayed arbitrarily.

If, in a further exemplary application, the voltage generator 2 is a VBLEQ voltage generator that generates a VBLEQ voltage provided for the equalize and precharge voltage level of the memory cells, the magnitude of the signal level to be read out is influenced. The VBLEQ active voltage generators are typically at a higher voltage level, such that pauses are provided in order to achieve a lower standby voltage level. This low voltage level constitutes a critical condition for the read-out of the memory information items. Therefore, an external selection of the voltage generator permits a reduction of the waiting time and the provision of a critical test condition without an undesired testing of other cells taking place as a result of a general reduction of the voltage level.

If a further exemplary application involves a $V_{INT}$ voltage generator contained in a $V_{INT}$ generator system which, in one possible implementation, is provided with two standby voltage generators and a total of six active voltage generators, an incorrect speed sorting can occur if no pauses are implemented before the reading, since the speed of a DRAM data signal path depends on the $V_{INT}$ voltage generated by the $V_{INT}$ voltage generator. If the $V_{INT}$ standby voltage generator is switched on in a targeted manner for reading, the bias margin can therefore be improved.

The method according to the invention is suitable for an application test and for a self-refresh test. In a self-refresh test, voltages are changed dynamically and so a different $V_{INT}$ voltage is used for a self-refresh entry than in the self-refresh exit. This is possible with the aid of the test method according to the invention.

The invention claimed is:

1. An integrated circuit, comprising:
    at least one integrated voltage generator for generating a load voltage for an associated integrated load;
    an integrated voltage generator test logic connected to said voltage generator which in a test operating mode switches the operating state of said integrated voltage generator between an active operating state and a standby operating state depending on an external control signal;
    an internal load switch for switching said generated load voltage to said integrated load, said internal load switch being controllable by means of an internal control signal;
    wherein said voltage generator test logic in said test operating mode switches the operating state of said integrated voltage generator independently of the associated internal control switching signal for setting a temporal voltage profile of said load voltage applied to said load, and
    wherein the external control signal is formed by a clock enable signal.

2. The integrated circuit according to claim 1,
    wherein an associated integrated voltage generator test logic is provided for each integrated voltage generator.

3. The integrated circuit according to claim 2,
    wherein provision is made of an integrated control unit for generating the internal control switching signals for driving said internal load switch.

4. The integrated circuit according to claim 3,
    wherein the integrated control unit changes over the respective voltage generator test logic between the test operating mode and a normal operating mode in a manner dependent on further external signals.

5. The integrated circuit according to claim 4,
    wherein the voltage generator test logic in the normal operating mode, in the case of a first logic signal level of the external control signal, sets the operating state of the associated integrated voltage generator in a manner dependent on the associated internal control switching signal and, in the case of a second logic signal level of the external control signal, sets the standby operating state as operating state of the associated integrated voltage generator.

6. The integrated circuit according to claim 5,
wherein the voltage generator test logic in the normal operating mode, in the case of the first logic signal level of the external control signal, sets the active operating state as operating state of the integrated voltage generator if the internal control signal switches the integrated voltage generator to the associated load, and sets the standby operating state as operating state of the integrated voltage generator if the internal control signal isolates the integrated voltage generator from the load.

7. The integrated circuit according to claim 1,
wherein the integrated voltage generator is connected to a thyristor for storing a switching charge.

8. The integrated circuit according to claim 1,
wherein the integrated voltage generator is connected to a reference voltage source.

9. The integrated circuit according to claim 1,
wherein the integrated circuit is a memory chip.

10. The integrated circuit according to claim 9,
wherein the integrated voltage generator generates a load voltage for at least one word line of a memory cell array of the memory chip.

11. The integrated circuit according to claim 1,
wherein an integrated voltage generator can be selected by means of an external code.

12. The integrated circuit according to claim 1,
wherein the integrated voltage generator has two operating states.

13. The integrated circuit according to claim 12,
wherein the integrated voltage generator is a VBLH generator.

14. The integrated circuit according to claim 12,
wherein the integrated voltage generator is a VBLEQ generator.

15. The integrated circuit according to claim 12,
wherein the integrated voltage generator is a $V_{INT}$ generator.

16. A method for testing an integrated circuit,
wherein in a test operating mode an integrated voltage generator being in a standby operating state is switched by means of an internal load switch which is controlled by means of internal control signal to an associated integrated load,
wherein the integrated voltage generator is then switched over by a connected integrated voltage generator test logic from the standby operating state to an active operating state in response to an external control signal,
wherein the voltage generator test logic switches the operating state of said integrated voltage generator independently of the internal control signal so set a temporal voltage profile of the load voltage applied to said load, and
wherein the external control signal is formed by a clock enable signal.

17. The method according to claim 16,
wherein the integrated circuit is a memory chip.

18. The method according to claim 16,
wherein an integrated voltage generator to be tested is selected by means of an external TM code.

19. A test system for testing an integrated circuit comprising:
at least one integrated voltage generator for generating a load voltage for an associated integrated load;
an integrated voltage generator test logic connected to said voltage generator which in a test operating mode switches the operating state of said integrated voltage generator between an active operating state and a standby operating state depending on an external control signal;
an internal load switch for switching said generated load voltage to said integrated load, said internal load switch being controllable by means of an internal control signal;
wherein said voltage generator test logic in said test operating mode switches the operating state of said integrated voltage generator independently of the associated internal control switching signal for setting a temporal voltage profile of said load voltage applied to said load, and
wherein the external control signal is formed by a clock enable signal.

* * * * *